(12) United States Patent
Kahen

(10) Patent No.: US 7,615,800 B2
(45) Date of Patent: Nov. 10, 2009

(54) QUANTUM DOT LIGHT EMITTING LAYER

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 349 days.

(21) Appl. No.: 11/226,622

(22) Filed: Sep. 14, 2005

(65) Prior Publication Data

US 2007/0057263 A1    Mar. 15, 2007

(51) Int. Cl.
*H01L 33/00* (2006.01)
(52) U.S. Cl. .................. 257/103; 257/13; 257/17; 257/E33.006; 977/950; 438/47
(58) Field of Classification Search ............ 257/103
See application file for complete search history.

(56) References Cited

U.S. PATENT DOCUMENTS

| 6,753,108 | B1 * | 6/2004 | Hampden-Smith et al. ..... 429/44 |
| 7,087,833 | B2 * | 8/2006 | Scher et al. ................. 136/252 |
| 7,150,910 | B2 * | 12/2006 | Eisler et al. ................. 428/325 |
| 2005/0051766 | A1 | 3/2005 | Stokes | |

FOREIGN PATENT DOCUMENTS

EP    1 231 250    8/2002

OTHER PUBLICATIONS

Tang et al, Organic electroluminescent diodes, Appl. Phys. Lett. 51, 913-915 (1987).

Burroughes et al., Light-emitting diodes based on conjugated polymers, Nature 347, 539-541 (1990).
Matoussi et al., Electroluminescence from heterostructures of poly(phenylene vinylene) and inorganic CdSe nanocrystals J. Appl. Phys. 83, 7965 (1998).
Hikmet et al., Study of conduction mechanism and electroluminescence in CdSe/Zns quantum dot composites, J. Appl. Phys. 93, 3509-3514 (2003).
Coe et al., Electroluminescence from single monolayers of nanocrystals in molecular organic devices, Nature 420, 800-802 (2002).
Mueller et al., Multicolor Light-Emitting Diodes Based on Semiconductor Nanocrystals Encapsulated in GaN Charge Injection Layers, Nano Letters 5, 1039-1044 (2005).
S. Nakamura et al., Bright electroluminescence from CdS quantum dot LED structures, Electron. Lett. 34, 2435-2436 (1998).
R. Rossetti et al., Quantum size effects in the redox potentials, resonance Raman spectra, and electronic spectra of CdS crystallites in aqueous solution, J. Chem. Phys. 79, 1086-1087 (1983).

(Continued)

*Primary Examiner*—Jerome Jackson, Jr.
(74) *Attorney, Agent, or Firm*—Raymond L. Owens

(57) ABSTRACT

An inorganic light emitting layer having a plurality of light emitting cores, each core having a semiconductor material that emits light in response to recombination of holes and electrons, each such light emitting core defining a first bandgap; a plurality of semiconductor shells formed respectively about the light emitting cores to form core/shell quantum dots, each such semiconductor shell having a second bandgap wider than the first bandgap; and a semiconductor matrix connected to the semiconductor shells to provide a conductive path through the semiconductor matrix and to each such semiconductor shell and its corresponding light emitting core so as to permit the recombination of holes and electrons.

24 Claims, 5 Drawing Sheets

OTHER PUBLICATIONS

R. Xie et al., Synthesis and Characterization of Highly Luminescent CdSe-Core CdS/ZN0.5Cd0.5S/ZnS Multishell Nanocrystals J. Am. Chem. Soc. 127, 74807488 (2005).

X. Peng et al., Epitaxial Growth of Highly Luminescent CdSe/CdS Core/Shell Nanocrystals with Photostability and Electronic Accessibility J. Am. Chem. Soc. 119, 7019-7029 (1997).

0. Masala and R. Seshadri, Synthesis Routes for Large Volumes Of Nanoparticles Annu. Rev. Mater. Res. 34, 41-81 (2004).

A. A. Bol et al., Factors Influencing the Luminescence Quantum Efficiency of Nanocrystalline ZnS:Mn2+, Phys. Stat. Sol. B224, 291-296 (2001).

R. Rossetti et al., Size effects in the excited electronic states of small colloidal CdS crystallites, J. Chem. Phys. 80, 4464-4469 (1984.

M. A. Hines et al., Synthesis and Characterization of Strongly Luminescing ZnS-Capped CdSe Nanocrystals, J. Phys. Chem. 100, 468-471 (1996).

A. R. Kortan et al., Nucleation and Growth of CdSe on ZnS Quantum Crystalline Seeds, and Vice Verse, in Inverse Micelle Media. Am. Chem. Soc. 112, 1327-1332 (1990).

C. B. Murray et al., Synthesis and Characterization of Monodisperse Nanocrystals and Close-Packed Nanocrystal Assemblies, Annu. Rev. Mater. Sci. 30, 545-593 (2000).

A. N. Goldstein et al., Melting in Semiconductor Nanocrystals, Science 256, 1425-1426 (1992).

S. B. Qadri et al., Size-induced transition-temperature reduction in nanoparticles of ZnS, Phys. Rev B60, 9191-9193 (1999).

S. A. Ivanov et al., Light-Amplification Using Inverted Core/Shell Nanocrystals: Towards Lasing in the Single-Exicton Regime, J. Phys. Chem. 108, 10625-10630 (2004).

D. V. Talapin et al., CdSe/CdS/ZnS and CdSe/ZnSe/ZnSe/Zns Core-Shell-Shell Nanocrystals, J. Phys. Chem. 108, 1882618831 (2004).

K. B. Kahen, Rigorous optical modeling of multilayer organic light-emitting diode devices, Appl. Phys. Lett. 78, 1649-1651 (2001).

S. W. Lim, High p-type doping of ZnSe using Li3N diffusion, Appl. Phys. Lett. 65, 2437-2438 (1994).

P. J. George et al., Doping of chemically deposited intrinsic CdS thin films to n type by thermal diffusion of indium, Appl. Phys. Lett. 66, 3624-3626 [1995].

M. A. Hines et al., Bright UV-Blue Luminescent Colloidal ZnSe Nanocrystals, J. Phys. Chem. B102, 36553657 [1998].

J. Lee et al., Thin Solid Films 431-432, 344 [2003.

A. A. Khosravi et al., Manganese doped zinc sulphide nanoparticles by aqueous method, Appl. Phys. Lett. 67, 2506-2508 [1995].

D. V. Talapin et al., Highly Luminescent Monodisperse SdSe and CdSe/ZnS Nanocrystals Synthesized in a Hexadecylamine-Trioctylphosphine Oxide-Trioctylphospine Mixture, Nano Lett. 4, 207-211 [2001].

"GaInP2 overgrowth and passivation of colloidal InP nanocrystals using metalorganic chemical vapor deposition" by M. C. Hanna et al., Applied Physics Letters, AIP, American Institute of Physics, Melville, NY, vol. 84, No. 5, Feb. 2, 2004, pp. 780-782.

* cited by examiner

QUANTUM DOT LIGHT EMITTING LAYER

FIELD OF THE INVENTION

The present invention relates to an inorganic light emitting diode device that includes a light emitting layer having quantum dots.

BACKGROUND OF THE INVENTION

Semiconductor light emitting diode (LED) devices have been made since the early 1960's and currently are manufactured for usage in a wide range of consumer and commercial applications. The layers comprising the LEDs are based on crystalline semiconductor materials which require ultra-high vacuum techniques for their growth, such as, molecular organic chemical vapor deposition. In addition, the layers typically need to be grown on nearly lattice-matched substrates in order to form defect-free layers. These crystalline-based inorganic LEDs have the advantages of high brightness (due to layers with high conductivities), long lifetimes, good environmental stability, and good external quantum efficiencies. The usage of crystalline semiconductor layers that results in all of these advantages, also leads to a number of disadvantages. The dominant ones are high manufacturing costs, difficulty in combining multi-color output from the same chip, the need for high cost and rigid substrates.

In the mid 1980's, organic light emitting diodes (OLED) were invented (Tang et al, Appl. Phys. Lett. 51, 913 (1987)) based on the usage of small molecular weight molecules. In the early 1990's, polymeric LEDs were invented (Burroughes et al., Nature 347, 539 (1990)). In the ensuing 15 years organic based LED displays have been brought out into the marketplace and there has been great improvements in device lifetime, efficiency, and brightness. For example, devices containing phosphorescent emitters have external quantum efficiencies as high as 19%; whereas, device lifetimes are routinely reported at many tens of thousands of hours. In comparison to crystalline-based inorganic LEDs, OLEDs have much reduced brightness (mainly due to small carrier mobilities), shorter lifetimes, and require expensive encapsulation for device operation. On the other hand, OLEDs enjoy the benefits of potential lower manufacturing cost, the ability to emit multi-colors from the same device, and the promise of flexible displays if the encapsulation issue can be resolved.

To improve the performance of OLEDs, in the later 1990's OLED devices containing mixed emitters of organics and quantum dots were introduced (Matoussi et al., J. Appl. Phys. 83, 7965 (1998)). The virtue of adding quantum dots to the emitter layers is that the color gamut of the device could be enhanced; red, green, and blue emission could be obtained by simply varying the quantum dot particle size; and the manufacturing cost could be reduced. Because of problems, such as, aggregation of the quantum dots in the emitter layer, the efficiency of these devices was rather low in comparison with typical OLED devices. The efficiency was even poorer when a neat film of quantum dots was used as the emitter layer (Hikmet et al., J. Appl. Phys. 93, 3509 (2003)). The poor efficiency was attributed to the insulating nature of the quantum dot layer. Later the efficiency was boosted (to ~1.5 cd/A) upon depositing a monolayer film of quantum dots between organic hole and electron transport layers (Coe et al., Nature 420, 800 (2002)). It was stated that luminescence from the quantum dots occurred mainly as a result of Forster energy transfer from excitons on the organic molecules (electron-hole recombination occurs on the organic molecules). Regardless of any future improvements in efficiency, these hybrid devices still suffer from all of the drawbacks associated with pure OLED devices.

Recently, a mainly all-inorganic LED was constructed (Mueller et al., Nano Letters 5, 1039 (2005)) by sandwiching a monolayer thick core/shell CdSe/ZnS quantum dot layer between vacuum deposited n- and p-GaN layers. The resulting device had a poor external quantum efficiency of 0.001 to 0.01%. Part of that problem could be associated with the organic ligands of trioctylphosphine oxide (TOPO) and trioctylphosphine (TOP) which were reported to be present post growth. These organic ligands are insulators and would result in poor electron and hole injection onto the quantum dots. In addition, the remainder of the structure is costly to manufacture, due to the usage of electron and hole semiconducting layers grown by high vacuum techniques, and the usage of sapphire substrates.

Accordingly, it would be highly beneficial to construct an all inorganic LED based on quantum dot emitters which was formed by low cost deposition techniques and whose individual layers showed good conductivity performance. The resulting LED would combine many of the desired attributes of crystalline LEDs with organic LEDs.

SUMMARY OF THE INVENTION

It is an object of this invention to provide an inorganic light emitting diode device whose emitter layer is formed from inorganic quantum dots, where the inorganic emitter layer is simultaneously conductive and light emissive. In addition, the diode device is formed via low cost deposition processes.

These objects are achieved by an inorganic light emitting layer comprising:

(a) a plurality of light emitting cores, each core having a semiconductor material that emits light in response to recombination of holes and electrons, each such light emitting core defining a first bandgap;

(b) a plurality of semiconductor shells formed respectively about the light emitting cores to form core/shell quantum dots, each such semiconductor shell having a second bandgap wider than the first bandgap; and (c) a semiconductor matrix connected to the semiconductor shells to provide a conductive path through the semiconductor matrix and to each such semiconductor shell and its corresponding light emitting core so as to permit the recombination of holes and electrons It is an advantage of the present invention to provide a way of forming a light emitting layer, whose emitting species are quantum dots, that is simultaneously luminescent and conductive. The light emitting layer includes a composite of conductive wide band gap nanoparticles and shelled quantum dot emitters. A thermal anneal is used to sinter the conductive nanoparticles amongst themselves and onto the surface of the quantum dots. As a result, the conductivity of the light emitting layer is enhanced, as is electron-hole injection into the quantum dots. To enable the quantum dots to survive the anneal step without a loss in their fluorescent efficiency (since the organic ligands passivating the quantum dots boil away during the anneal process), the quantum dot shells are engineered to confine the electrons and holes, such that, their wavefunctions do not sample the surface states of the outer shell.

It is also an advantage of the present invention to incorporate the conductive and luminescent light emitting layer in an all inorganic light emitting diode device. The electron and hole transport layers are composed of conductive nanoparticles; in addition, separate thermal anneal steps are used to enhance the conductivities of these layers. All of the nanoparticles and quantum dots are synthesized chemically and made into colloidal dispersions. Consequently, all of the device layers are deposited by low cost processes, such as, drop casting or inkjetting. The resulting all inorganic light emitting diode device is low cost, can be formed on a range of substrates, and can be tuned to emit over a wide range of visible and infrared wavelengths. In comparison to organic-based light emitting diode devices, its brightness should be enhanced and its encapsulation requirements should be reduced.

DETAILED DESCRIPTION OF THE INVENTION

Using quantum dots as the emitters in light emitting diodes confers the advantage that the emission wavelength can be simply tuned by varying the size of the quantum dot particle. As such, spectrally narrow (resulting in a larger color gamut), multi-color emission can occur from the same substrate. If the quantum dots are prepared by colloidal methods [and not grown by high vacuum deposition techniques (S. Nakamura et al., Electron. Lett. 34, 2435 (1998))], then the substrate no longer needs to be expensive or lattice matched to the LED semiconductor system. For example, the substrate could be glass, plastic, metal foil, or Si. Forming quantum dot LEDs using these techniques is highly desirably, especially if low cost deposition techniques are used to deposit the LED layers.

Figure 1:
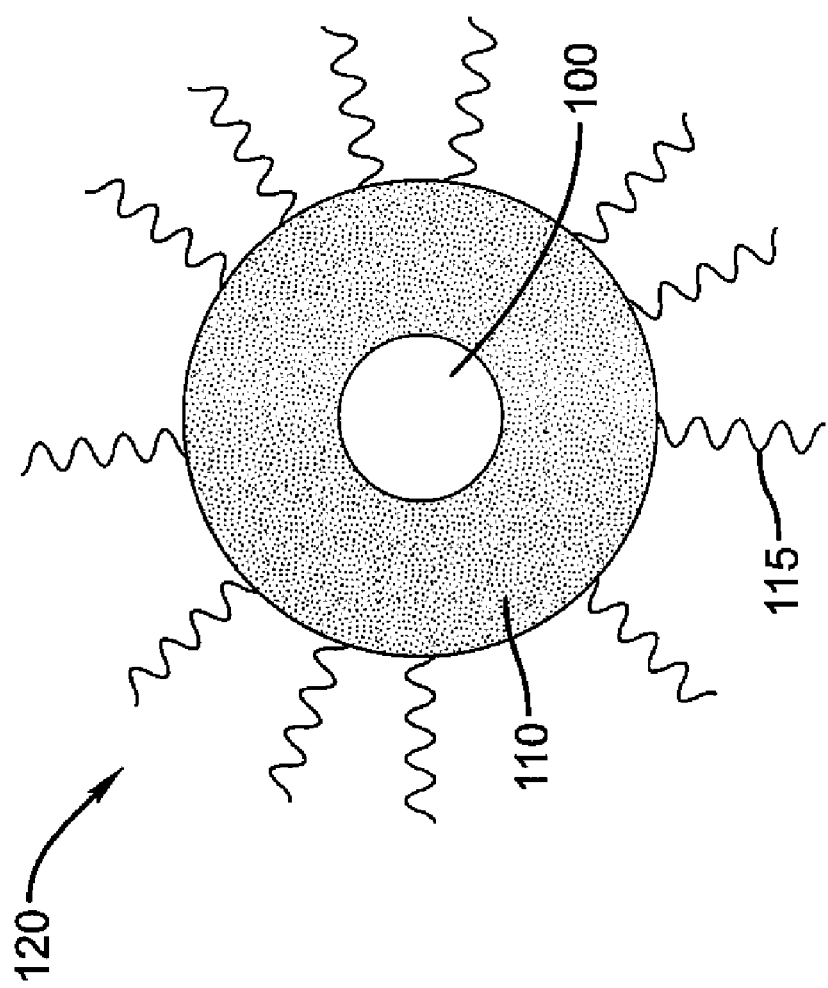
FIG. 1 shows a schematic of a core/shell quantum dot particle.

A schematic of a core/shell quantum dot 120 emitter is shown in FIG. 1. The particle contains a light emitting core 100, a semiconductor shell 110, and organic ligands 115. Since the size of typical quantum dots is on the order of a few nm and commensurate with that of its intrinsic exciton, both the absorption and emission peaks of the particle are blue shifted relative to bulk values (R. Rossetti et al., J. Chem. Phys. 79, 1086 (1983)). As a result of the small size of the quantum dots, the surface electronic states of the dots have a large impact on the dot's fluorescence quantum yield. The electronic surface states of the light emitting core 100 can be passivated either by attaching appropriate (e.g., primary amines) organic ligands 115 to its surface or by epitaxially growing another semiconductor (the semiconductor shell 110) around the light emitting core 100. The advantages of growing the semiconductor shell 110 (relative to organically passivated cores) are that both the hole and electron core particle surface states can be simultaneously passivated, the resulting quantum yields are typically higher, and the quantum dots are more photostable and chemically robust. Because of the limited thickness of the semiconductor shell 110 (typically 1-2 monolayers), its electronic surface states also need to be passivated. Again, organic ligands 115 are the common choice. Taking the example of a CdSe/ZnS core/shell quantum dot 120, the valence and conduction band offsets at the core/shell interface are such that the resulting potentials act to confine both the holes and electrons to the core region. Since the electrons are typically lighter than the heavy holes, the holes are largely confined to the cores, while the electrons penetrate into the shell and sample its electronic surface states associated with the metal atoms (R. Xie et al., J. Am. Chem. Soc. 127, 7480 (2005)). Accordingly, for the case of CdSe/ZnS core/shell quantum dots 120, only the shell's electron surface states need to be passivated; an example of a suitable organic ligand 120 would be one of the primary amines which forms a donor/acceptor bond to the surface Zn atoms (X. Peng et al., J. Am. Chem. Soc. 119, 7019 (1997)). In summary, typical highly luminescent quantum dots have a core/shell structure (higher bandgap surrounding a lower band gap) and have non-conductive organic ligands 120 attached to the shell's surface.

Colloidal dispersions of highly luminescent core/shell quantum dots have been fabricated by many workers over the past decade (O. Masala and R. Seshadri, Annu. Rev. Mater. Res. 34, 41 (2004)). The light emitting core 100 is composed of type IV (Si), III-V (InAs), or II-VI (CdTe) semiconductive material. For emission in the visible part of the spectrum, CdSe is a preferred core material since by varying the diameter (1.9 to 6.7 nm) of the CdSe core, the emission wavelength can be tuned from 465 to 640 nm. As is well-known in the art, visible emitting quantum dots can be fabricated from other material systems, such as, doped ZnS (A. A. Bol et al., Phys. Stat. Sol. B224, 291 (2001)). The light emitting cores 100 are made by chemical methods well known in the art. Typical synthetic routes are decomposition of molecular precursors at high temperatures in coordinating solvents, solvothermal methods (O. Masala and R. Seshadri, Annu. Rev. Mater. Res. 34, 41 (2004)) and arrested precipitation (R. Rossetti et al., J. Chem. Phys. 80, 4464 (1984)). The semiconductor shell 110 is typically composed of type II-VI semiconductive material, such as, CdS or ZnSe. The shell semiconductor is typically chosen to be nearly lattice matched to the core material and have valence and conduction band levels such that the core holes and electrons are largely confined to the core region of the quantum dot. Preferred shell material for CdSe cores is $ZnSe_xS_{1-x}$, with x varying from 0.0 to ~0.5. Formation of the semiconductor shell 110 surrounding the light emitting core 100 is typically accomplished via the decomposition of molecular precursors at high temperatures in coordinating solvents (M. A. Hines et al., J. Phys. Chem. 100, 468 (1996)) or reverse micelle techniques (A. R. Kortan et al., J. Am. Chem. Soc. 112, 1327 (1990)).

As is well known in the art, two low cost means for forming quantum dot films is depositing the colloidal dispersion of core/shell quantum dots 120 by drop casting and spin casting. Common solvents for drop casting quantum dots are a 9:1 mixture of hexane:octane (C. B. Murray et al., Annu. Rev. Mater. Sci. 30, 545 (2000)). The organic ligands 115 need to be chosen such that the quantum dot particles are soluble in hexane. As such, organic ligands with hydrocarbon-based tails are good choices, such as, the alkylamines. Using well-known procedures in the art, the ligands coming from the growth procedure (TOPO, for example) can be exchanged for the organic ligand 115 of choice (C. B. Murray et al., Annu. Rev. Mater. Sci. 30, 545 (2000)). When spin casting a colloidal dispersion of quantum dots, the requirements of the solvent are that it easily spreads on the deposition surface and the solvents evaporate at a moderate rate during the spinning process. It was found that alcohol-based solvents are a good choice; for example, combining a low boiling point alcohol, such as, ethanol, with higher boiling point alcohols, such as, a butanol-hexanol mixture, results in good film formation. Correspondingly, ligand exchange can be used to attach an organic ligand (to the quantum dots) whose tail is soluble in polar solvents; pyridine is an example of a suitable ligand. The quantum dot films resulting from these two deposition processes are luminescent, but non-conductive. The films are resistive since non-conductive organic ligands separate the core/shell quantum dot 120 particles. The films are also resistive since as mobile charges propagate along the quantum dots, the mobile charges get trapped in the core regions due to the confining potential barrier of the semiconductor shell 110.

Figure 2:
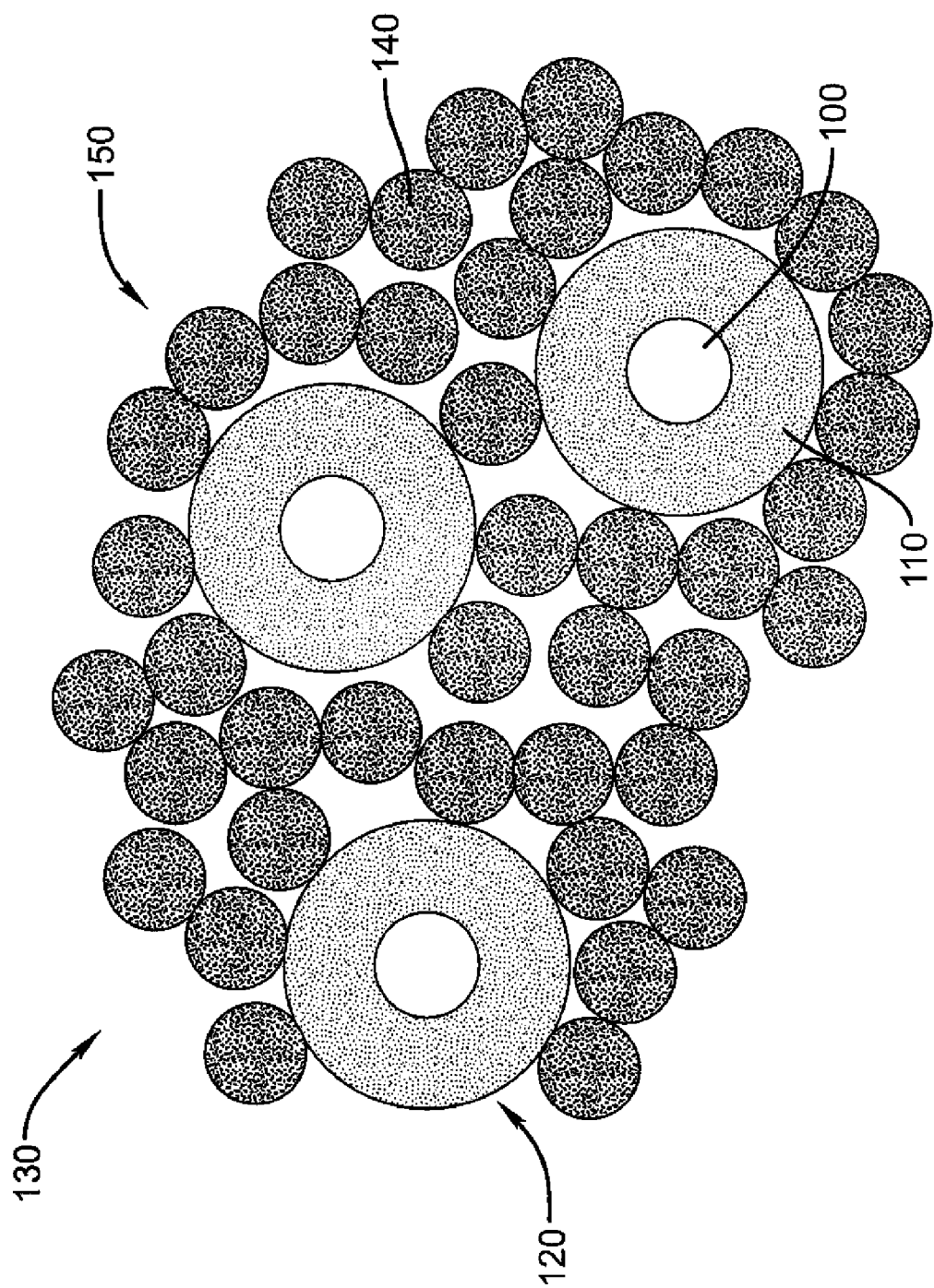
FIG. 2 shows a schematic of a section of an inorganic light emitting layer in accordance with the invention.

Proper operation of inorganic LEDs typically requires low resistivity n-type and p-type transport layers, surrounding a conductive (nominally doped) and luminescent emitter layer. As discussed above, typical quantum dot films are luminescent, but insulating. FIG. 2 schematically illustrates a way of providing an inorganic light emitting layer 150 that is simultaneously luminescent and conductive. The concept is based on co-depositing small (<2 nm), conductive inorganic nanoparticles 140 along with the core/shell quantum dots 120 to form the inorganic light emitting layer 150. A subsequent inert gas (Ar or $N_2$) anneal step is used to sinter the smaller inorganic nanoparticles 140 amongst themselves and onto the surface of the larger core/shell quantum dots 120. Sintering the inorganic nanoparticles 140, results in the creation of a continuous, conductive semiconductor matrix 130. Through the sintering process, this matrix is also connected to the core/shell quantum dots 120. As such, a conductive path is created from the edges of the inorganic light emitting layer 150, through the semiconductor matrix 130 and to each core/shell quantum dot 120, where electrons and holes recombine in the light emitting cores 100. It should also be noted that encasing the core/shell quantum dots 120 in the conductive semiconductor matrix 130 has the added benefit that it protects the quantum dots environmentally from the effects of both oxygen and moisture.

The inorganic nanoparticles 140 need to be composed of conductive semiconductive material, such as, type IV (Si), III-V (GaP), or II-VI (ZnS or ZnSe) semiconductors. In order to easily inject charge into the core/shell quantum dots 120, it is preferred that the inorganic nanoparticles 140 be composed of a semiconductor material with a band gap comparable to that of the semiconductor shell 110 material, more specifically a band gap within 0.2 eV of the shell material's band gap. For the case that ZnS is the outer shell of the core/shell quantum dots 120, then the inorganic nanoparticles 140 are composed of ZnS or ZnSSe with a low Se content. The inorganic nanoparticles 140 are made by chemical methods well known in the art. Typical synthetic routes are decomposition of molecular precursors at high temperatures in coordinating solvents, solvothermal methods (O. Masala and R. Seshadri, Annu. Rev. Mater. Res. 34, 41 (2004)) and arrested precipitation (R. Rossetti et al., J. Chem. Phys. 80, 4464 (1984)). As is well known in the art, nanometer-sized nanoparticles melt at a much reduced temperature relative to their bulk counterparts (A. N. Goldstein et al., Science 256, 1425 (1992)). Correspondingly, it is desirable that the inorganic nanoparticles 140 have diameters less than 2 nm in order to enhance the sintering process, with a preferred size of 1-1.5 nm. With respect to the larger core/shell quantum dots 120 with ZnS shells, it has been reported that 2.8 nm ZnS particles are relatively stable for anneal temperatures up to 350° C. (S. B. Qadri et al., Phys. Rev B60, 9191 (1999)). Combining these two results, the anneal process has a preferred temperature between 250 and 300° C. and a duration up to 60 minutes, which sinters the smaller inorganic nanoparticles 140 amongst themselves and onto the surface of the larger core/shell quantum dots 120, whereas the larger core/shell quantum dots 120 remain relatively stable in shape and size.

To form the inorganic light emitting layer 150, a co-dispersion of inorganic nanoparticles 140 and core/shell quantum dots 120 is formed. Since it is desirable that the core/shell quantum dots 120 be surrounded by the inorganic nanoparticles 140 in the inorganic light emitting layer 150, the ratio of inorganic nanoparticles 140 to core/shell quantum dots 120 is chosen to be greater than 1:1. A preferred ratio is 2:1 or 3:1. Depending on the deposition process, such as, spin casting or drop casting, an appropriate choice of organic ligands 115 is made. Typically, the same organic ligands 115 are used for both types of particles. In order to enhance the conductivity (and electron-hole injection process) of the inorganic light emitting layer 150, it is preferred that the organic ligands 115 attached to both the core/shell quantum dots 120 and the inorganic nanoparticles 140 evaporate as a result of annealing the inorganic light emitting layer 150 in an inert atmosphere. By choosing the organic ligands 115 to have a low boiling point, they can be made to evaporate from the film during the annealing process (C. B. Murray et al., Annu. Rev. Mater. Sci. 30, 545 (2000)). Consequently, for films formed by drop casting, shorter chained primary amines, such as, hexylamine are preferred; for films formed by spin casting, pyridine is a preferred ligand. Annealing thin films at elevated temperatures can result in cracking of the films due to thermal expansion mismatches between the film and the substrate. To avoid this problem, it is preferred that the anneal temperature be ramped from 25° C. to the anneal temperature and from the anneal temperature back down to room temperature. A preferred ramp time is on the order of 30 minutes. The thickness of the resulting inorganic light emitting layer 150 should be between 10 and 100 nm.

Following the anneal step, the core/shell quantum dots 120 would be devoid of an outer shell of organic ligands 115. For the case of CdSe/ZnS quantum dots, having no outer ligand shell would result in a loss of free electrons due to trapping by the shell's unpassivated surface states (R. Xie, J. Am. Chem. Soc. 127, 7480 (2005)). Consequently, the annealed core/shell quantum dots 120 would show a reduced quantum yield compared to the unannealed dots. To avoid this situation, the ZnS shell thickness needs to be increased to such an extent whereby the core/shell quantum dot electron wavefunction no longer samples the shell's surface states. Using calculational techniques well known in the art (S. A. Ivanov et al., J. Phys. Chem. 108, 10625 (2004)), the thickness of the ZnS shell needs to be at least 5 monolayers (ML) thick in order to negate the influence of the electron surface states. However, up to a 2 ML thick shell of ZnS can be directly grown on CdSe without the generation of defects due to the lattice mismatch between the two semiconductor lattices (D. V. Talapin et al., J. Phys. Chem. 108, 18826 (2004)). To avoid the lattice defects, an intermediate shell of ZnSe can be grown between the CdSe core and the ZnS outer shell. This approach was taken by Talapin et al. (D. V. Talapin et al., J. Phys. Chem. B108, 18826 (2004)), where they were able to grow up to an 8 ML thick shell of ZnS on a CdSe core, with an optimum ZnSe shell thickness of 1.5 ML. More sophisticated approaches can also be taken to minimize the lattice mismatch difference, for instance, smoothly varying the semiconductor content of the intermediate shell from CdSe to ZnS over the distance of a number of monolayers (R. Xie et al., J. Am. Chem. Soc. 127, 7480 (2005)). In sum the thickness of the outer shell is made sufficiently thick so that neither free carrier samples the electronic surface states. Additionally, if necessary, intermediate shells of appropriate semiconductor content are added to the quantum dot in order to avoid the generation of defects associated with thick semiconductor shells 110.

Figure 3:
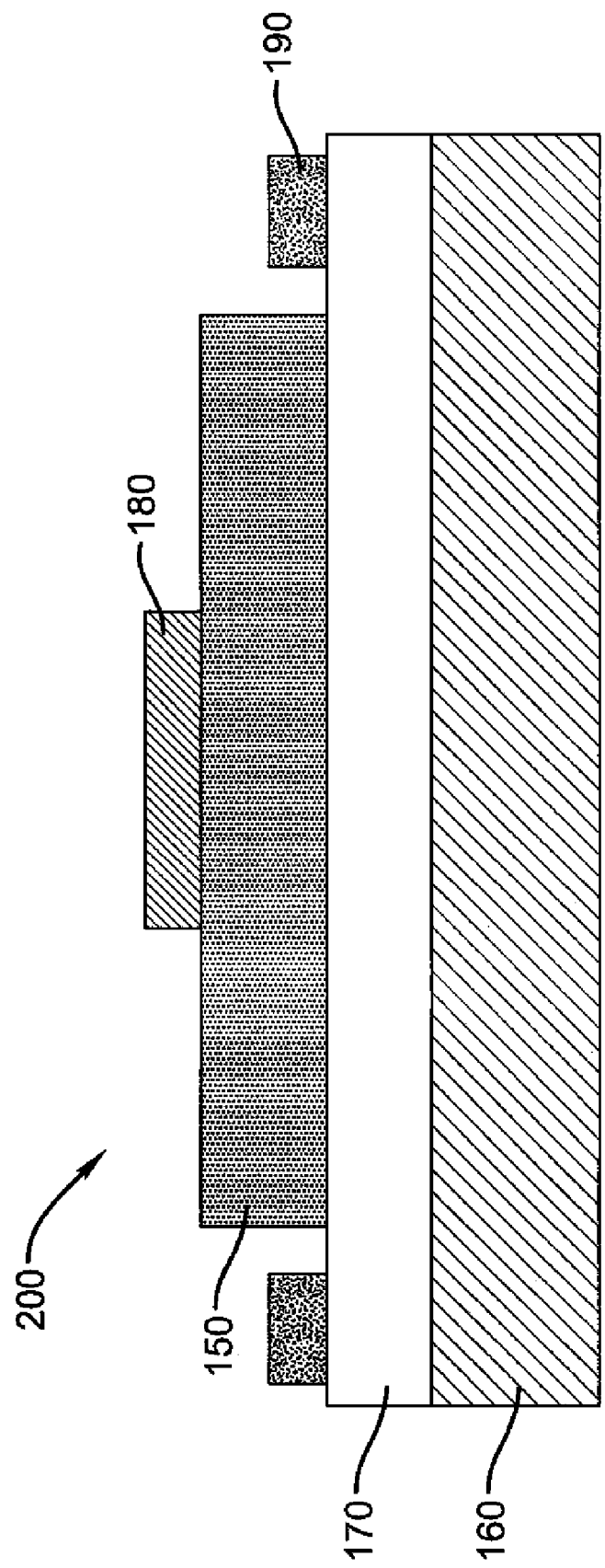
FIG. 3 shows a side-view schematic of an inorganic light emitting device in accordance with the present invention.

FIG. 3 gives the simplest example of an electroluminescent LED device 200 that incorporates the inorganic light emitting layer 150. A substrate 160 supports the deposited semiconductor and metal layers; its only requirements are that it is sufficiently rigid to enable the deposition processes and that it can withstand the thermal annealing processes (maximum temperatures of ~285° C.). It can be transparent or opaque. Possible substrate materials are glass, silicon, metal foils, and some plastics. The next deposited material is an anode 170. For the case where the substrate 160 is p-type Si, the anode 170 needs to be deposited on the bottom surface of the substrate 160. A suitable anode metal for p-Si is Al. It can be deposited by thermal evaporation or sputtering. Following its deposition, it is annealed at ~430° C. for 20 minutes. For all of the other substrate types named above, the anode 170 is deposited on the top surface of the substrate 160 (as shown in FIG. 3) and includes a transparent conductor, such as, indium tin oxide (ITO). The ITO can be deposited by sputtering or other well-known procedures in the art. The ITO is typically annealed at ~300° C. for 1 hour to improve its transparency. Because the sheet resistance of transparent conductors, such as, ITO, are much greater than that of metals, bus metal 190 can be selectively deposited through a shadow mask using thermal evaporation or sputtering to lower the voltage drop from the contact pads to the actual device. Next is deposited the inorganic light emitting layer 150. As discussed above it can be drop or spin casted onto the transparent conductor (or Si substrate). Other deposition techniques, such as, inkjetting the colloidal quantum dot-inorganic nanoparticle mixture is also possible. Following the deposition, the inorganic light emitting layer 150 is annealed at a preferred temperature of 270° C. for 50 minutes. Lastly, a cathode 180 metal is deposited over the inorganic light emitting layer 150. Candidate cathode 180 metals are ones that form an ohmic contact with the material including the inorganic nanoparticles 140. For example, for the case of ZnS inorganic nanoparticles 140, a preferred metal is Al. It can be deposited by thermal evaporation or sputtering, followed by a thermal anneal at 285° C. for 10 minutes. Those skilled in the art can also infer that the layer composition can be inverted, such that, the cathode 180 is deposited on the substrate 160 and the anode is formed on the inorganic light emitting layer 150. For the case of Si supports, the substrate 160 is n-type Si.

Figure 4:
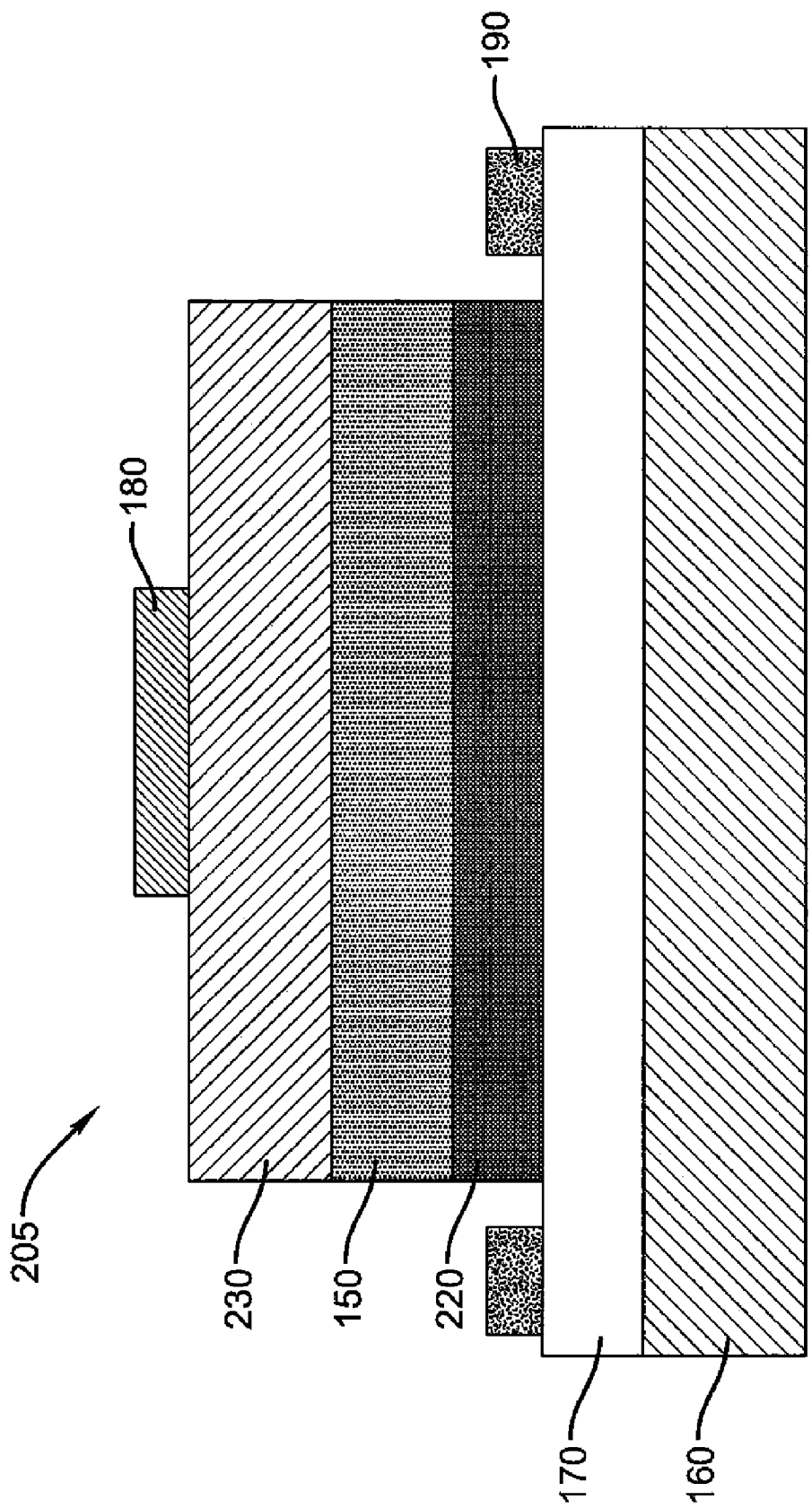
FIG. 4 shows a side-view schematic of another embodiment of an inorganic light emitting device in accordance with the present invention.

FIG. 4 gives another embodiment of an electroluminescent LED device 205 that incorporates the inorganic light emitting layer 150. The figure shows that a p-type transport layer 220 and an n-type transport layer 230 are added to the device and surround the inorganic light emitting layer 150. As is well-known in the art, LED structures typically contain doped n- and p-type transport layers. They serve a few different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects (K. B. Kahen, Appl. Phys. Lett. 78, 1649 (2001)), having metal layers adjacent to emitter layers results in a loss emitter efficiency. Consequently, it is advantageous to space the emitters layers from the metal contacts by sufficiently thick (at least 150 nm) transport layers. Finally, not only do the transport layers inject electron and holes into the emitter layer, but, by proper choice of materials, they can prevent the leakage of the carriers back out of the emitter layer. For example, if the inorganic nanoparticles 140 were composed of $ZnS_{0.5}Se_{0.5}$ and the transport layers were composed of ZnS, then the electrons and holes would be confined to the emitter layer by the ZnS potential barrier. Suitable materials for the p-type transport layer include II-VI and III-V semiconductors. Typical II-VI semiconductors are ZnSe, ZnS, or ZnTe. Only ZnTe is naturally p-type, while ZnSe and ZnS are n-type. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at ~350° C. to create p-type ZnSe, with resistivities as low as 0.4 ohm-cm (S. W. Lim, Appl. Phys. Lett. 65, 2437 (1994)).

Suitable materials for the n-type transport layer include II-VI and III-V semiconductors. Typical II-VI semiconductors are ZnSe or ZnS. As for the p-type transport layers, to get sufficiently high n-type conductivity, additional n-type dopants should be added to the semiconductors. For the case of II-VI n-type transport layers, possible candidate dopants are the Type III dopants of Al, In, or Ga. As is well known in the art, these dopants can be added to the layer either by ion implantation (followed by an anneal) or by a diffusion process (P. J. George et al., Appl. Phys. Lett. 66, 3624 [1995]). A more preferred route is to add the dopant in-situ during the chemical synthesis of the nanoparticle. Taking the example of ZnSe particles formed in a hexadecylamine (HDA)/TOPO coordinating solvent (M. A. Hines et al., J. Phys. Chem. B102, 3655 [1998]), the Zn source is diethylzinc in hexane and the Se source is Se powder dissolved in TOP (forms TOPSe). If the ZnSe were to be doped with Al, then a corresponding percentage (a few percent relative to the diethylzinc concentration) of trimethylaluminum in hexane would be added to the syringe containing TOP, TOPSe, and diethylzinc. In-situ doping processes like these have been successfully demonstrated when growing thin films by a chemical bath deposition process (J. Lee et al., Thin Solid Films 431-432, 344 [2003]). It should be noted that in reference to FIG. 4, the diode can also operate with only a p-type transport layer or an n-type transport layer added to the structure. Those skilled in the art can also infer that the layer composition can be inverted, such that, the cathode 180 is deposited on the substrate 160 and the anode is formed on the p-type transport layer 220. For the case of Si supports, the substrate 160 is n-type Si.

The following examples are presented as further understandings of the present invention and are not to be construed as limitations thereon.

EXAMPLE 1

Figure 5:
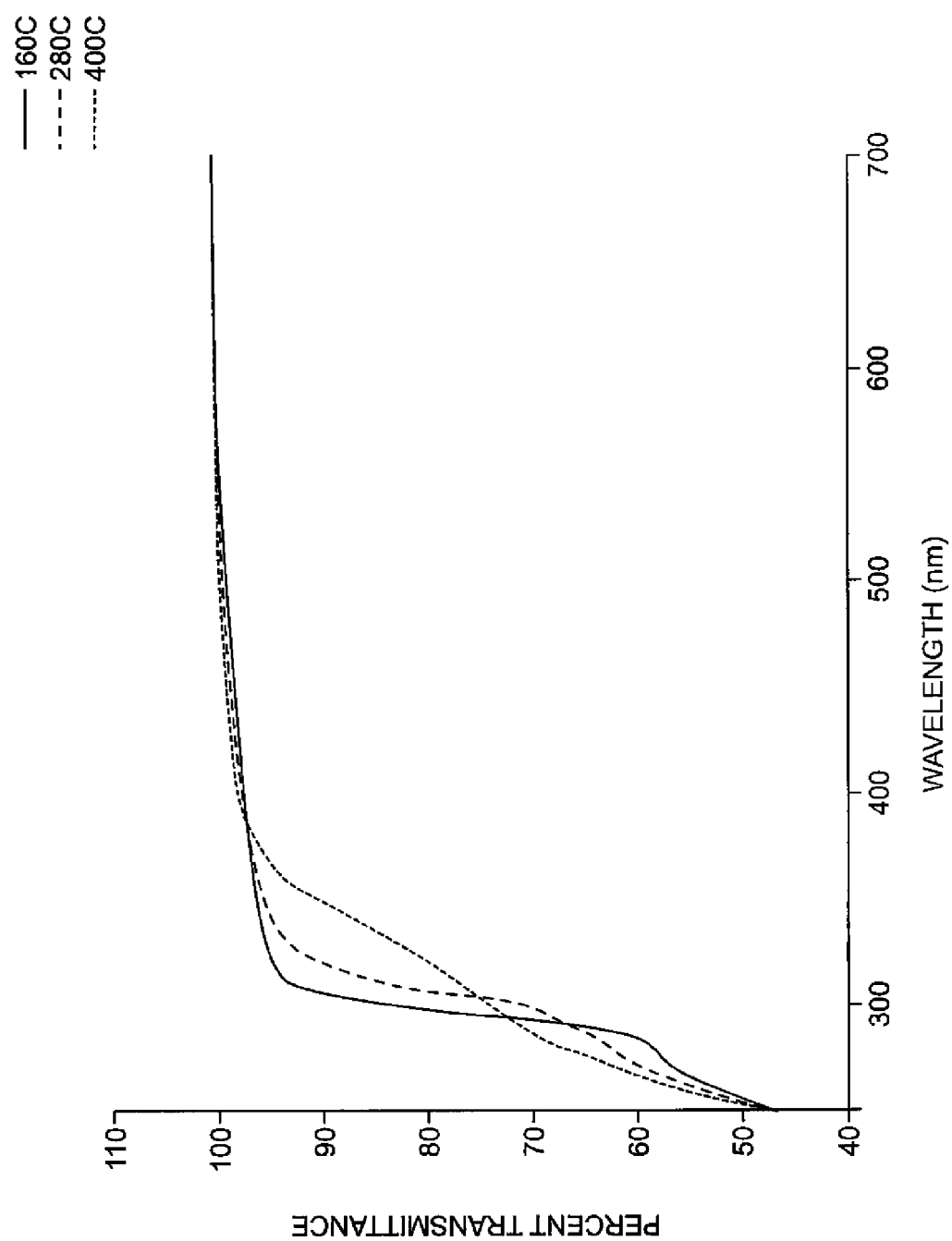
FIG. 5 shows a plot of the transmittance of a thin film of ZnS.

An inorganic light emitting layer 150 was formed in accordance with the schematic of FIG. 2. The inorganic nanoparticles 140 were composed of ZnS, while the core/shell quantum dots 120 had a CdSe core and a ZnSe/ZnS shell. The ZnS particles were chemically synthesized using an adaptation of the method reported by Khosravi et al. (A. A. Khosravi et al., Appl. Phys. Lett. 67, 2506 [1995]). The Zn source was $ZnCl_2$, the sulfur source was bis(trimethylsilyl)sulfide $(TMS)_2S$, and the surfactant/ligand was hexylamine. Butanol solutions of $ZnCl_2$, $(TMS)_2S$, and hexylamine, each at 0.02 M, were prepared and equal volume of each solution was used in the reaction. To prevent the oxidation of the resulting ZnS nanoparticles, the reaction was performed under inert conditions using well-known procedures. Initially, 5 ml of the zinc chloride solution and 5 ml of the hexylamine solution are combined in a two-neck flask, while vigorously stirring the mixture. Next, 5 ml of the $(TMS)_2S$ solution is added dropwise to the flask at a rate between 0.1-1 ml/minute, while continuing to vigorously stir the mixture. The resulting three-component solution was then placed in a rotary evaporator to distill off ~13 ml of butanol from the solution. Following the addition of an excess of methanol, the solution is centrifuged and the supernatant is decanted. To redissolve the precipate, 0.5 ml of toluene is added. Once more an excess of methanol is added to the solution, followed by centrifugation and decanting of the supernatant. The resulting precipate is soluble in a variety of non-polar solvents. Since the colloidal dispersion of ZnS inorganic nanoparticles 140 and CdSe/ZnSe/ZnS core/shell quantum dots 120 is deposited by drop casting, the precipate is dissolved in a 9:1 solvent mixture of hexane:octane (C. B. Murray et al., Annu. Rev. Mater. Sci. 30, 545 [2000]). The resulting colloidal dispersion is optically clear, but under 360 nm excitation emits near UV/violet light. FIG. 5 plots the transmittance of a film of ZnS nanoparticles following 10 minute thermal anneals at three different temperatures. FIG. 5 shows that the ZnS particles are very small (<2 nm), since the blue shift from its bulk bandgap (~3.6 eV) is significant; and, begin to sinter together at temperatures around 280° C. As discussed above, it is preferred that the inorganic nanoparticles 140 be very small (<2 nm) in order to enable sintering at lower temperatures.

The core/shell quantum dots 120 are synthesized following along the lines of Talapin et al. (D. V. Talapin et al., J. Phys. Chem. B108, 18826 [2004]). To form the CdSe cores, a "green" synthetic route is carried out under Schlenk line and argon flow. Initially 8 g of TOPO, 5 g of HDA, and 0.15 g of n-tetradecylphosphonic acid (TDPA) are combined in a three-neck flask following standard degassing and drying procedures. 2 ml of a 1 M TOPSe solution is added to the flask and the mixture is heated to 300° C. A cadmium stock solution (0.12 g of cadmium acetate in 3 ml of TOP) is quickly injected via syringe into the flask, while the solution is being vigorously stirred. As a result of injecting the room temperature stock solution, the reaction temperature immediately falls ~25° C. It is maintained at 260° C. for 7.5 minutes in order to form green emitting core quantum dots with an emission wavelength of ~530 nm.

Next a thin shell (~1.5 ML) of ZnSe is deposited on the core CdSe quantum dots. To begin, 3.6 ml of the core quantum dot crude solution (not washed) is combined with 20 g of TOPO and 12 g of HDA (both coordinating solvents are degassed and dried prior to addition to the flask) in a three-neck flask. The resulting mixture is taken to 190° C. In a drybox, a syringe is filled with the Zn and Se precursors (0.3 mmol of diethylzinc, 0.39 mmol of TOPSe and 3 ml of additional TOP). The contents of the syringe are then slowly added to the flask at a rate of 5 ml/hour, while vigorously stirring the solution. Immediately following the injection of the ZnSe precursors, ~5 ML of a ZnS outer shell are deposited on the ZnSe shelled quantum dots. This time the syringe is filled with 3 mmol of diethylzinc (from a 1 M diethylzinc in hexane solution), 1.38 ml of (TMS)$_2$S, and 12 ml of TOP. The syringe contents are added at a rate of 8 ml/hour, where the growth temperature is set to 210° C. After completing the ZnS shell growth, the reaction mixture is cooled to 90° C. and left at that temperature for 60 minutes. Finally, 11 ml of butanol was added to the mixture to prevent it from solidifying below the freezing points of TOPO and HDA. The resulting core/shell/shell quantum dots are slightly red-shifted (relative to the core emission) and have a greenish-yellow emission color (~545 nm). The measured quantum yield is in excess of 50%.

The inorganic light emitter layer 150 includes a composite of ZnS inorganic nanoparticles 140 and CdSe/ZnSe/ZnS core/shell quantum dots 120. As such, a colloidal dispersion of CdSe/ZnSe/ZnS core/shell quantum dots 120 was formed using 9:1 hexane:octane as the solvent, where hexylamine was the organic ligand attached to the quantum dots. Since the as-synthesized core/shell quantum dots 120 have TOPO/HDA as the surface ligands, a ligand exchange procedure (D. V. Talapin et al., Nano Lett. 4, 207 [2001]) was performed to passivate the quantum dots with hexylamine. Following the addition of an excess of methanol to the ligand-exchanged dispersion, the solution is centrifuged and the supernatant is decanted. To redissolve the precipate, 1.0 ml of toluene is added. Once more an excess of methanol is added to the solution, followed by centrifugation and decanting of the supernatant. The resulting precipate was redissolved in the 9:1 hexane:octane solvent mixture. Please note that both the ligand exchange and the particle washings were performed under airless conditions. The composite colloidal dispersion of ZnS nanoparticles and CdSe/ZnSe/ZnS quantum dots was drop cast onto a substrate (Si or glass) using a volume ratio of component dispersions of 2:1, respectively. The resulting film was annealed at 270° C. in a tube furnace under constant Ar flow for 50 minutes (taking 35 minutes to ramp up to 270° C. and 35 minutes to ramp back down to room temperature). The resulting film fluorescence was clearly visible in bright room lights and again was a greenish-yellow color. The films appeared to be stable in air, with no observable decay in fluorescence yield after many hours of observation. The film was also conductive, with a resistivity on the order of $10^4$ ohm-cm.

EXAMPLE 2

Electroluminescent light emitting diodes were constructed using the above inorganic light emitting layer 120 as a component. ITO was sputtered onto the surface of a cleaned glass substrate 160 through a shadowmask. Following the deposition, the ITO film was annealed at 300° C. for 1 hour to improve its transparency. Next the inorganic light emitting layer 120, as described in Example 1, was deposited on the surface of the ITO. To ensure a pinhole free layer, the composite (ZnS nanoparticles and CdSe/ZnSe/ZnS core/shell/shells) colloidal dispersion was drop cast twice (each drop cast was followed by a 50 minute anneal at 270° C. in the tube furnace). Prior to the two drop casts, the deposition surface was cleaned by an acetone/methanol solvent wash, followed by blow drying the sample with nitrogen.

Next the n-type transport layer 230 was deposited. It was formed from ZnSe nanoparticles. The nanoparticles were synthesized (carried out under Schlenk line and argon flow) using the high temperature decomposition of molecular precursors in coordinating solvents. More specifically, 7 g of HDA was (dried and degassed) placed in a three-neck flask and heated to 300° C. In a drybox, a syringe is filled with 0.8 mmol of diethylzinc (from a 1 M diethylzinc in hexane solution), 0.8 mmol of TOPSe, and 2.5 ml of additional TOP. The syringe contents are quickly injected into the flask, while the solution is being vigorously stirred. As a result of injecting the room temperature Zn/Se stock solution, the reaction temperature immediately falls ~25° C. It is maintained at 270° C. for 3 minutes in order to form near UV/violet emitting ZnSe nanoparticles. Prior to cooling back to room temperature, 7 ml of butanol is added to the solution to prevent the HDA from solidifying. Since it is desirable to drop cast out of hexylamine, a standard ligand exchange is performed to remove the HDA ligands and replace them with hexylamine ligands. The resulting ligand exchanged solution was then placed in a rotary evaporator to distill off any excess butanol and hexylamine from the solution. Following the addition of an excess of methanol, the solution is centrifuged and the supernatant is decanted. To redissolve the precipate, 0.25 ml of toluene is added. Once more an excess of methanol is added to the solution, followed by centrifugation and decanting of the supernatant. The resulting precipate was redissolved in the 9:1 hexane:octane solvent mixture. To ensure a pinhole free layer, the ZnSe colloidal dispersion was drop cast twice (each drop cast was followed by a 50 minute anneal at 270° C. in the tube furnace). Prior to the two drop casts, the deposition surface was cleaned by an acetone/methanol solvent wash, followed by blow drying the sample with nitrogen.

A patterned cathode 180 was then deposited on the n-type ZnSe transport layer 230. Aluminum was thermally evaporated through a shadowmask to form a 400 nm thick film. To make a better contact to the ZnSe, the Al was annealed at 285° C. for 10 minutes (the temperature was ramped from 25° C. to 285° C. and back down to 25° C.). The LED emitted light through the glass substrate 160 at the intersection of the patterned cathode 180 and anode 170 (ITO) contacts. The area of intersection was approximately 5 mm$^2$. The LED emitted greenish-yellow light that was visible under subdued ambient lighting conditions. The emission required a voltage across the device of at least 7-8 V. The devices could handle direct currents up to 100 mA (2 A/cm$^2$) prior to catastrophic failure after a few minutes of continuous operation.

The invention has been described in detail with particular reference to certain preferred embodiments thereof, but it will be understood that variations and modifications can be effected within the spirit and scope of the invention.

PARTS LIST 100 light emitting core
110 semiconductor shell
115 organic ligands
120 core/shell quantum dot
130 semiconductor matrix
140 inorganic nanoparticles
150 inorganic light emitting layer
160 substrate
170 anode
180 cathode
190 bus metal
200 inorganic light emitting device
205 inorganic light emitting device
220 p-type transport layer
230 n-type transport layer

The invention claimed is:

1. An inorganic light emitting layer comprising:
    (a) a plurality of light emitting cores, each core having a semiconductor material that emits light in response to recombination of holes and electrons, each such light emitting core defining a first bandgap;
    (b) a semiconductor shell formed completely around each light emitting core to form core/shell quantum dots, each such semiconductor shell having a second bandgap wider than the first bandgap; and
    (c) a semiconductor matrix including separate inorganic nanoparticles made of Type IV, III-V, or II-VI semiconductor material connected to the semiconductor shells to provide a conductive path through the semiconductor matrix and to each such semiconductor shell and its corresponding light emitting core so as to permit the recombination of holes and electrons, the inorganic nanoparticles having a different composition from that of the core/shell quantum dots.

2. The inorganic light emitting layer of claim 1 wherein each light emitting core includes a Type IV, III-V, or II-VI semiconductor material.

3. The inorganic light emitting layer of claim 2 wherein each light emitting core includes CdSe.

4. The inorganic light emitting layer of claim 1 wherein each semiconductor shell includes a Type II-VI semiconductor material.

5. The inorganic light emitting layer of claim 4 wherein each semiconductor shell includes ZnS.

6. The inorganic light emitting layer of claim 2 wherein each semiconductor shell includes a Type II-VI semiconductor material.

7. The inorganic light emitting layer of claim 1 wherein the bandgap of the semiconductor matrix material is within 0.2 eV of the bandgap of the semiconductor shell material.

8. A method of making an organic light emitting device comprising:
    (a) a plurality of light emitting cores, each core having a semiconductor material that emits light in response to recombination of holes and electrons, each such light emitting core defining a first bandgap;
    (b) a semiconductor shell formed completely around each light emitting core to form core/shell quantum dots, each such semiconductor shell having a second bandgap wider than the first bandgap; and
    (c) a semiconductor matrix including separate inorganic nanoparticles made of Type IV, III-V, or II-VI semiconductor material connected to the semiconductor shells to provide a conductive path through the semiconductor matrix and to each such semiconductor shell and its corresponding light emitting core so as to permit the recombination of holes and electrons, the inorganic nanoparticles having a different composition from that of the core/shell quantum dots; further including:
    (d) providing a colloidal dispersion of the core/shell quantum dots and semiconductor matrix nanoparticles;
    (e) depositing the colloidal dispersion to form a film; and
    (f) annealing the film to form an inorganic light emitting layer.

9. The method of claim 8 wherein the layer thickness is 10 to 100 nm.

10. The method of claim 8 wherein the deposited film is annealed at a temperature between 250 and 300 C for up to 60 minutes.

11. An inorganic light emitting device according to claim 1 comprising:
    (a) spaced anode and cathode electrodes; and
    (b) the inorganic light emitting layer disposed between the anode and cathode electrodes.

12. The inorganic light emitting device of claim 11 including a p-type transport layer disposed between the anode and inorganic light-emitting layer.

13. The inorganic light emitting device of claim 12 wherein the p-type transport layer includes p-type ZnSe, ZnS, or ZnTe.

14. The inorganic light emitting device of claim 12 wherein the conductivity of the p-type transport layer is enhanced by a dopant including nitrogen or lithium or both.

15. The inorganic light emitting device of claim 11 including a n-type transport layer disposed between the cathode and inorganic light-emitting layer.

16. The inorganic light emitting device of claim 15 wherein the n-type transport layer includes n-type ZnSe or ZnS.

17. The inorganic light emitting device of claim 15 wherein the conductivity of the n-type transport layer is enhanced by a Type III dopant including Al, In, or Ga.

18. The inorganic light emitting device of claim 12 including a n-type transport layer disposed between the cathode and inorganic light-emitting layer.

19. The inorganic light emitting device of claim 18 wherein the n-type transport layer includes n-type ZnSe, or ZnS.

20. The inorganic light emitting device of claim 18 wherein the conductivity of the n-type transport layer is enhanced by a Type III dopant including Al, In, or Ga.

21. An inorganic light emitting device according to claim 1 comprising:
   (a) a substrate;
   (a) an anode formed on the substrate and a cathode spaced from the anode; and
   (b) the inorganic light emitting layer disposed between the anode and cathode.

22. The inorganic light emitting device of claim 21 wherein the substrate includes p-type semiconductor material.

23. The inorganic light emitting device of claim 22 wherein the light emitting layer is formed on one side of the substrate and the anode is formed on the other side of the substrate.

24. The inorganic light emitting device of claim 21 wherein the substrate is formed of glass, metal foil, or plastic and the anode is formed on the substrate.

* * * * *

UNITED STATES PATENT AND TRADEMARK OFFICE
CERTIFICATE OF CORRECTION

PATENT NO. : 7,615,800 B2
APPLICATION NO. : 11/226622
DATED : November 10, 2009
INVENTOR(S) : Liang-Sheng Liao et al.

It is certified that error appears in the above-identified patent and that said Letters Patent is hereby corrected as shown below:

| | |
|---|---|
| Column 12, line 12 | In Claim 8, delete "organic" and insert -- inorganic --, therefor. |
| Column 13, line 7 | In Claim 21, delete "(a)" and insert -- (b) --, therefor. |
| Column 13, line 9 | In Claim 21, delete "(b)" and insert -- (c) --, therefor. |

Signed and Sealed this

Nineteenth Day of January, 2010

David J. Kappos
*Director of the United States Patent and Trademark Office*